United States Patent [19]
Lee

[11] Patent Number: 5,846,859
[45] Date of Patent: Dec. 8, 1998

[54] METHOD FOR MANUFACTURING A SEMICONDUCTOR MEMORY DEVICE HAVING CAPACITIVE STORAGE

[75] Inventor: Sang-in Lee, Kyungki-do, Rep. of Korea

[73] Assignee: Samsung Electronics Co., Ltd., Kyungki-Do, Rep. of Korea

[21] Appl. No.: 606,193

[22] Filed: Feb. 23, 1996

[30] Foreign Application Priority Data

Mar. 14, 1995 [KR] Rep. of Korea ............ 1995 5260

[51] Int. Cl.⁶ ............................................. H01L 21/8242
[52] U.S. Cl. .......................... 438/253; 438/254; 438/240; 148/DIG. 148
[58] Field of Search .................. 437/47, 48, 52, 437/60, 719; 148/DIG. 148; 438/238–239, 253, 254, 396, 397, 240

[56] References Cited

U.S. PATENT DOCUMENTS

| | | | |
|---|---|---|---|
| 4,757,028 | 7/1988 | Kondoh et al. | 437/40 |
| 4,847,215 | 7/1989 | Hanaki et al. | 437/100 |
| 5,206,787 | 4/1993 | Fujioka | 257/307 |
| 5,607,874 | 3/1997 | Wang et al. | 437/52 |
| 5,641,702 | 6/1997 | Imai et al. | 438/396 |

FOREIGN PATENT DOCUMENTS 2523371  9/1983  France .

*Primary Examiner*—Joni Chang
*Attorney, Agent, or Firm*—Cushman Darby&Cushman IP Group of Pillsbury Madison & Sutro LLP

[57] ABSTRACT

A capacitor in a semiconductor device having a dielectric film formed of high dielectric material and a manufacturing method therefor are provided. The capacitor consists of electrodes including a dielectric film and an amorphous SiC layer. Thus, the diffusion of oxygen atoms through a grain boundary into an underlayer and the formation of an oxide layer on the surface of the SiC layer can both be prevented, providing for a highly reliable capacitor electrode and an equivalent oxide thickness which is no thicker than required.

14 Claims, 3 Drawing Sheets

METHOD FOR MANUFACTURING A SEMICONDUCTOR MEMORY DEVICE HAVING CAPACITIVE STORAGE

BACKGROUND OF THE INVENTION

The present invention relates to a semiconductor memory device and a manufacturing method therefor, and more particularly, to a capacitor in a semiconductor memory device which has electrodes including a silicon carbide layer and a manufacturing method therefor.

Each cell of a semiconductor memory device, e.g., a DRAM device, has a capacitor for storing information, and in order to ensure the accurate reading out of the stored data, the capacitance thereof should be sufficiently large. With recent advances in integration technology, however, integration has increased by a factor of four, while typical DRAM chip area has only increased 1.4 times, which translates a one-thirds relative reduction of the area of a memory cell. Therefore, since capacitor structures must be improved to obtain a larger capacitance within the smaller area, the dielectric film's thickness must be reduced, the capacitor's effective area must be increased or a material having a higher dielectric constant must be used. The present invention corresponds to the third type method.

Conventional dielectric films include silicon dioxide ($SiO_2$), silicon nitride ($Si_3N_4$), or a combination thereof i.e., ONO ($SiO_2/Si_3N_4/SiO_2$) or NO ($Si_3N_4/SiO_2$) structure. These materials, however, have rather low dielectric constants, so that a complicated three-dimensional storage electrode is required for next-generation DRAM devices or the thickness of the dielectric film must be dangerously thin. To avoid these problems in DRAM capacitors, high-dielectric materials, e.g., $Ta_2O_5$ or $TiO_2$, and ferroelectric, e.g., $SrTiO_3$ (STO) or $(Ba, Sr)TiO_3$ (BSTO) and paraelectric materials, have all been suggested for use as the dielectric film, in which case it is preferable that titanium nitride (TiN), a composition layer of TiN and polysilicon, or tungsten be used as the material constituting the electrodes.

In such cases, however, subsequent heat-treatment or Boro-Phosphorus Silicate Glass (BPSG) deposition/reflow processing activates the oxygen atoms of the dielectric film, so that they combine with the capacitor electrode material, thus increasing the equivalent oxide thickness of a dielectric film and generating leakage current. Particularly, should the capacitor electrodes be formed of TiN, oxygen atoms combine with the electrode material when forming the dielectric film under an $O_2$ atmosphere, to thereby form $TiO_2$ on the interfaces of the capacitor electrodes and dielectric film, and an underlayer may become oxidized by the diffusion of oxygen atoms through TiN grain boundaries. Furthermore, should the underlayer be formed of polysilicon, a $SiO_2$ film is generated between the TiN and polysilicon, to thereby result in increasing the equivalent oxide thickness of a dielectric film. Meanwhile, should the dielectric film be formed of STO or BSTO, platinum is generally used for the capacitor electrodes to prevent the oxidation thereof, but cannot be well etched when etching for its low vapor pressure.

Therefore, when the dielectric film of a next-generation DRAM capacitor is formed of an insulating material having a high dielectric constant, a ferroelectric material, or a paraelectric material, the capacitor electrodes should be formed by a material which exhibits excellent resistance to oxidation, can be simply etched and can prevent oxygen atoms from being diffused through a grain boundary.

SUMMARY OF THE INVENTION

Accordingly, it is an object of the present invention to provide a capacitor in a semiconductor device wherein the reliability of the capacitor is improved, by providing excellent resistance to electrode oxidation and preventing the diffusion of oxygen atoms through a grain boundary.

It is another object of the present invention to provide a manufacturing method suitable for the above capacitor.

To accomplish the above first object, there is provided a capacitor in a semiconductor device comprising: a dielectric film; and an electrode including an amorphous silicon carbide (SiC) layer.

In the capacitor according to the present invention, it is preferable that: the electrode be formed of the amorphous SiC layer in contact with the dielectric film and an impurity-doped polysilicon layer in contact with the amorphous SiC layer; that the dielectric film be made of an insulator having a high dielectric constant, a ferroelectric or a paraelectric; and that the amorphous SiC layer be doped with impurities.

To accomplish the above second object, there is provided a manufacturing method for a capacitor in a semiconductor device comprising the steps of: forming a first electrode the surface whereof is formed of an amorphous first SiC layer; forming a dielectric film on the first electrode; and forming a second electrode on the dielectric film.

In the method according to the present invention, it is preferable that: the first electrode formation step be carried out in one chamber without breaking vacuum, by forming a first polysilicon layer doped with impurities, the surface of which is hydrogen-treated using hydrogen plasma or a hydrogen radical or via a hydrogen baking process and is then phosphorus-treated, and forming the first SiC layer on the doped first polysilicon layer; and that the dielectric film be formed of an insulator having a high dielectric constant, a ferroelectric or a paraelectric It is further preferable that, after the first electrode formation step, the steps of forming a pattern by anisotropically etching the first polysilicon layer and the amorphous first SiC layer, forming a second amorphous SiC layer on the entire surface in a semiconductor substrate where a pattern is formed, and forming a spacer on the sidewalls of the pattern by anisotropically etching the second amorphous SiC layer are additionally performed; and that the second electrode formation step be performed by forming an amorphous third SiC layer on the dielectric film and forming a second polysilicon layer doped with impurities on the amorphous third SiC layer.

It is still further preferable that the SiC layer is formed by a plasma chemical vapor deposition (CVD) method where a mixed gas of silane ($SiH_4$) and propane ($C_3H_8$) or of silane ($SiH_4$) and benzene ($C_6H_6$) is used, and by adding phosphine ($PH_3$) or arsenic hydride ($AsH_3$) thereto, and that impurities therein are activated through heat treatment at 800° C. for 10~30 seconds under an argon (Ar) atmosphere or by depositing and then reflowing an insulating material on the entire substrate resulting from the second electrode formation step.

According to a capacitor in a semiconductor device and a manufacturing method therefor, capacitor electrodes consist of an amorphous SiC layer having an excellent resistance to oxidation, so that the diffusion of oxygen atoms through a grain boundary and into an underlayer and the formation of an oxide layer on the surface of a SiC layer can be prevented. Therefore, capacitor electrodes having high reliability, where an equivalent oxide film is not thicker than required, can be manufactured.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION structure

Figure 1:
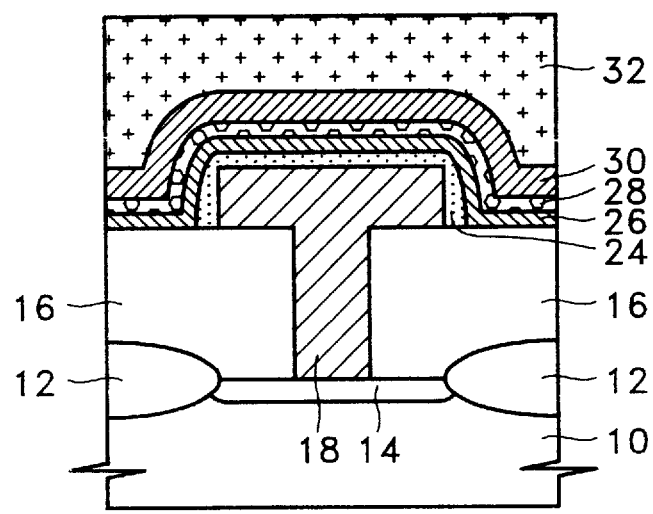
FIG. 1 is a sectional view showing a capacitor in a semiconductor device manufactured by a method according to the present invention.

FIG. 1 is a sectional view showing a capacitor in a semiconductor device manufactured by a method according to the present invention.

Reference numeral 10 denotes a semiconductor substrate, reference numeral 12 denotes a field oxide, reference numeral 14 denotes a source, reference numeral 16 denotes an insulating interlayer, reference numeral 18 denotes a first polysilicon layer, reference numeral 24 denotes a lower SiC layer, reference numeral 26 a dielectric film, reference numeral 28 denotes a upper SiC layer, reference numeral 30 denotes a second polysilicon layer, and reference numeral 32 denotes a BPSG film.

First polysilicon layer 18 and lower SiC layer 24 constitute the storage electrode, upper SiC layer 28 and second polysilicon layer 30 constitute the plate electrode. Dielectric film 26 is formed between the storage and plate electrodes.

The silicon carbide (SIC) formed according to the present invention has a melting point of 2,700° C. and is a refractory material having a 2.2 eV band gap and a coefficient of thermal expansion of $3.9 \times 10^{-6}/°C$. The SiC can be obtained by reacting silane ($SiH_4$) with propane ($C_3H_8$) or benzene ($C_6H_6$), by thermal decomposition of methyl trichlorosilane ($CH_3SiCl_3$), by reacting tetrachlorosilane ($SiCl_4$) with methane ($CH_4$), or by reacting dichlorosilane ($SiH_2Cl_2$) with propane ($C_3H_8$). Here, the thermal decomposition method is to suitable for the manufacturing process of a semiconductor device, since it involves temperatures of 1,0000° C. and higher.

The SiC formed by the above method is not suitable to material for capacitor electrodes due to an intrinsic resistivity (ρ) of 10 k ohm-centimeters. According to the present invention, the intrinsic resistivity of the SiC is improved by forming lower and upper SIC layers where phosphorus is doped by plasma chemical deposition using silane, propane, and phosphine ($PH_3$) as the source gas.

Further, the lower and upper SIC layers 24 and 28 exist in an amorphous state and thus have no grain boundaries, the diffusion of the oxygen atoms included in the dielectric film through a grain boundary into an underlayer can be prevented.

Molybdenum nickel ($Mo_{46}Ni_{54}$), molybdenum silicon ($Mo_{60}Si_{40}$), nickel tungsten ($Ni_{38}W_{62}$), and niobium nickel ($Nb_{40}Ni_{60}$) are amorphous metals but are deficient in resistance to oxidation, and thus are not suitable for the material of the capacitor electrodes.

According to the present invention, SiC of an amorphous state having excellent resistance to oxidation is used for a barrier metal, so that the diffusion of oxygen atoms through a grain boundary into an underlayer, i.e., a polysilicon layer, and oxidation of the barrier metal itself can both be prevented.

method (a) phosphine ($PH_3$) or arsenic hydride ($AsH_3$) for lowering the intrinsic resistivity is injected into a plasma where silane ($SiH_4$) and propane ($C_3H_8$), or silane ($SiH_4$) and benzene ($C_6H_6$) are used as source gas, and then are deposited by a CVD method, to thereby form a first SiC layer of an amorphous state where impurities are doped.

(b) A dielectric film such as tantalum pentoxide ($Ta_2O_5$), (Ba,Sr)$TiO_3$ (BSTO) or $SrTiO_3$ (STO) is formed on a SiC layer.

(c) A second SiC layer of an amorphous state where impurities are doped is formed by using the method as illustrated in (a).

Here, in order to activate an impurity-ion doped in a SiC layer, usual processes of heat treatment at high temperature can be performed, after the processes of (a) and (c), respectively. The impurity-ion doped in the SiC layer can be activated during a process of deposition/reflow of a BPSG layer which is performed after a capacitor is completed, even though a particular heat treatment at high temperature is not performed.

Referring to attached drawings, the present invention will now be described in more detail.

FIGS. 2A–2F are sectional views for illustrating a method of manufacturing a capacitor in a semiconductor memory device according to the present invention.

Figure 2A:
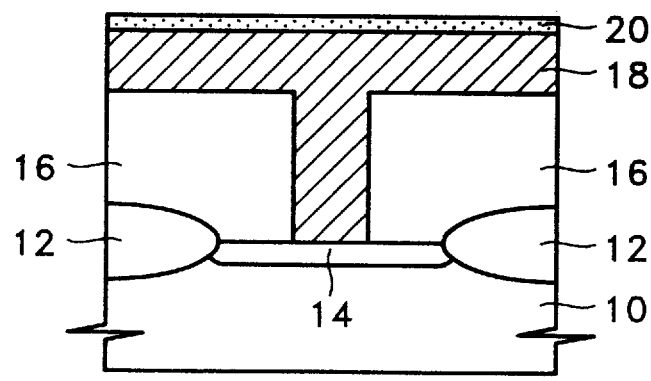
FIGS. 2A–2F are sectional views for illustrating a manufacturing method of a capacitor in a semiconductor device according to the present invention.

First, FIG. 2A shows a process of forming a first polysilicon layer 18 and a first SiC layer 20. Here, the processes are performed as follows: a first process of forming an insulating interlayer 16 on a semiconductor substrate 10 where transistors are formed; a second process of forming a contact hole for contacting storage electrodes with source 14 of transistors; a third process of depositing a first polysilicon layer 18, where impurities are doped, in the form of burying the contact hole on the entire surface of the resultant substrate where contact holes are formed, for example, to approximately a thickness 1,000~3,000 Å; and a fourth process of forming the first SiC layer 20 of a thickness of, for example, 100~500 Å, where impurities are doped on first polysilicon layer 18, without breaking vacuum in-situ process.

The first SiC layer 20 is deposited at substrate temperature 200°~500° C. by a plasma CVD method using mixed gas where gas of silane 100~500 sccm and propane 200~800 sccm is added to phosphine 10~200 sccm.

Here, the plasma has conditions of 13.56 MHz and the RF power 100~500 Watt.

It is preferable to perform the third and fourth processes by using an the same chamber or a cluster tool.

When the same chamber is used, the first polysilicon 18 is deposited by a usual thermal CVD method after the RF power becomes 0 Watt, or formed by plasma-enhanced CVD after the RF current is supplied. Here, propane of source gas is turned off when first polysilicon layer 18 is formed, and is turned on when first SiC layer 20 is formed.

In order to increase the reaction of silicon (Si) and carbon (C), hydrogen ($H_2$) can be added when plasma for forming a SiC layer is deposited.

Before the SiC layer is formed, the base vacuum is maintained below $10_{-7}$ Torr by using a turbomoleculer pump.

If vacuum break of a chamber is essentially necessary after the first polysilicon layer is deposited, by using hydrogen plasma, by using remote plasma using radical, or by using hydrogen bake at high temperature, a natural oxide film formed on the surface of first polysilicon layer 18 is eliminated and then the surface of the polysilicon layer 18 is processed by phosphorus depending upon pouring phosphine ($PH_3$) on the entire surface of the resultant substrate, before SiC is deposited.

Further, first SiC layer 20 can be deposited by a plasma CVD method using mixed gas where $AsH_3$ is added to silane and propane, or formed by a plasma CVD method using mixed gas where phosphine or $AsH_3$ is added to silane and benzon.

Figure 2B:
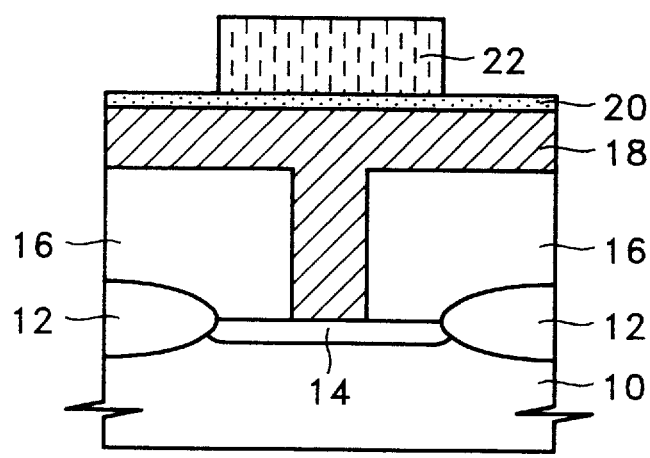

FIG. 2B shows a process of forming a photoresist film pattern 22 for forming storage electrodes. Here, a photoresist film is coated on first SiC layer 20 and then the photoresist film is patterned by a photolithography, to thereby form photoresist film pattern 22 for forming the storage electrodes.

Figure 2C:
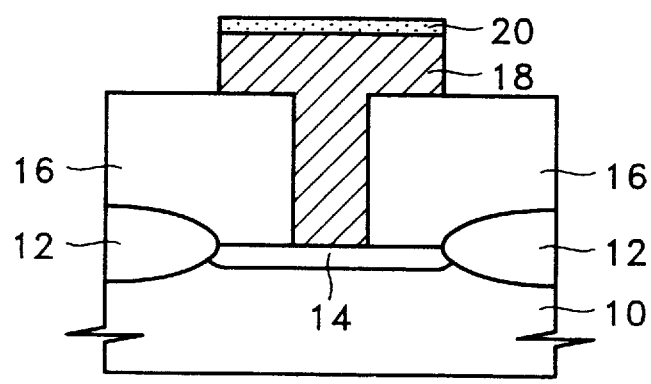

FIG. 2C shows a process of forming storage electrode patterns 18 and 20. Here, first SiC layer 20 and first polysilicon layer 18 are anisotropically etched by using photoresist film pattern 22 in FIG. 2B as a mask, to thereby form storage electrode patterns 18 and 20 defined by each cell.

Figure 2D:
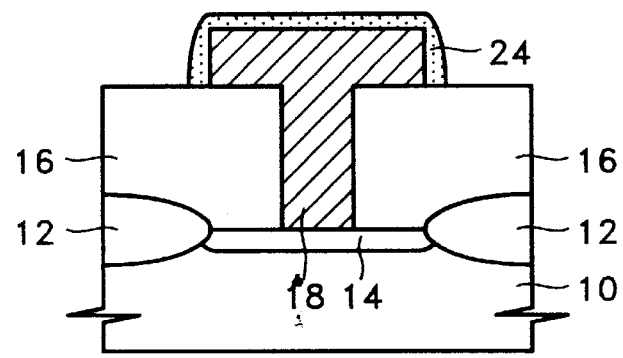

FIG. 2D shows a process of completing storage electrodes 18 and 24. Here, first, a natural oxide film formed on the sidewalls of first polysilicon layer 18 is eliminated by the same method as that described in FIG. 2A, and then the surface is processed by phosphorus. Second, an amorphous second SiC layer where impurities are doped is formed on the entire surface of the resultant substrate processed by phosphorus to a thickness of approximately 100~500 Å. Third, the second SiC layer is anisotropically etched, to thereby form spacers consisting of the second SiC layer on the sidewalls of first polysilicon layer 18.

The storage electrodes consist of first polysilicon layer 18 and a lower SiC layer 24 formed in the form of surrounding first polysilicon layer 18.

When the activation of an impurity-ion doped in a lower SiC layer 24 is necessary, the processes to FIG. 2D are performed and then the resultant substrate from process of FIG. 2D is treated by a rapid thermal process under the argon (Ar) atmosphere, at a temperature 800°~1,000° C. for 10~30 seconds.

Figure 2E:
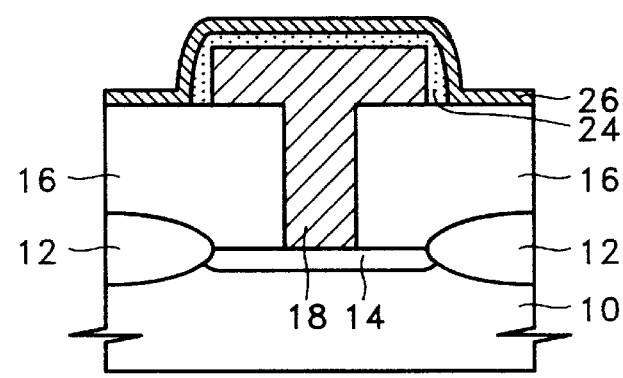

FIG. 2E shows a process of forming a-dielectric film 26. The dielectric film can be made of a material selected from the groups consisting of an insulator having a high dielectric constant, a ferroelectric and a paraelectric. Here, dielectric material such as $Ta_2O_5$, titanium dioxide ($TiO_2$), $SrTiO_3$ (STO), or $(Ba,Sr)TiO_3$ (BSTO) is deposited on the entire surface of storage electrodes 18 and 24, to thereby form dielectric film 26. The $Ta_2O_5$ film is deposited by a thermal CVD method, and an STO or BSTO film is deposited by a sputtering method.

According to this embodiment, the $Ta_2O_5$ film is deposited by a low pressure CVD method which has the conditions of a temperature of 470° C., an oxygen ($O_2$) to tantalum epoxide ($Ta(OC_2H_5)_5$) ratio of 120:1, and total gas flow of 3~6 slm.

Here, the thickness of $Ta_2O_5$ is approximately 100 Å. After $Ta_2O_5$ film is deposited, a bake process using ultraviolet (UV)-$O_3$ is performed at 450° C., or a process of annealing at 800° C. is performed under the dry-$O_2$ atmosphere.

In order to prevent the leakage current, it is preferable that dielectric film 26 is usually equal to or thicker than 50 Å.

Figure 2F:
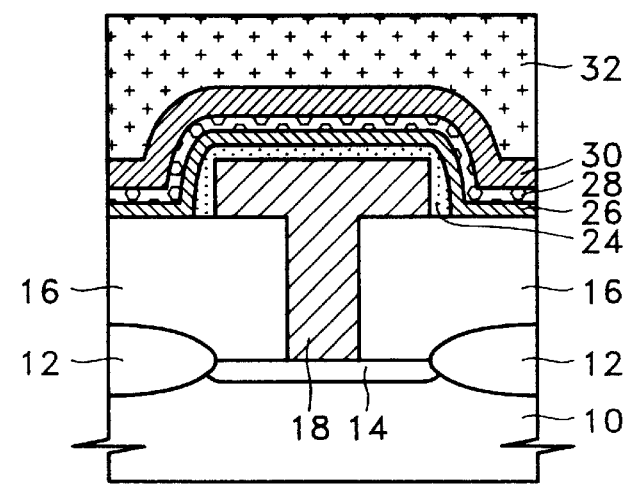

FIG. 2F shows a process of forming plate electrodes 28 and 30. Here, first, a upper SiC layer 28 is formed on dielectric film 26 to a thickness of approximately 100~500 Å. Second, second polysilicon layer 30 where impurities are doped is formed on upper SiC layer 28. Third, a BPSG layer 32 is formed by coating/reflow BPSG on the resultant substrate where upper SiC layer 28 is formed.

In order to activate impurity-ion doped in upper SiC layer 28, after the first process is performed, the upper SiC layer can be additionally treated under the argon atmosphere by a rapid thermal process at 800°~1,000° C. for 10~30 seconds.

However, impurity-ion doped in the SiC layer is activated by heat-energy supplied during coating and reflow of BPSG so that the heat treatment is not necessary.

In a capacitor in a semiconductor memory device and a manufacturing method therefore according to the present invention, capacitor electrodes are formed of an amorphous SiC layer having excellent resistance to oxidation so that diffusion of oxygen atoms towards an underlayer and formation of an oxide layer on the surface of the SiC layer can be prevented. Accordingly, capacitor electrodes having high reliability where an equivalent oxide thickness becomes not thicker than required can be formed.

It should be understood that the invention is not limited to the illustrated embodiment and that many changes and modifications can be made within scope of the invention.

What is claimed is:

1. A manufacturing method for a capacitor in a semiconductor memory device comprising the steps of:

forming a first electrode having an amorphous first silicon carbide (SiC) layer on a surface of a semiconductor substrate, said first electrode formation step being performed by forming a first polysilicon layer doped with impurities and forming said amorphous first SiC layer on said first polysilicon layer;

forming a dielectric film on said first silicon carbide layer; and forming a second electrode, having a second silicon carbide (SiC) layer, on said dielectric film, said second layer being disposed on the dielectric film.

2. A manufacturing method for a capacitor in a semiconductor memory according to claim 1, wherein said dielectric film is made of a material selected from the group consisting of a ferroelectric and a paraelectric insulator.

3. A manufacturing method for a capacitor according to claim 1, wherein said first electrode formation step further comprises a step of forming a pattern by anisotropically etching said first polysilicon layer and said amorphous first SiC layer; a step of forming an amorphous second SiC layer on the entire surface in the semiconductor substrate where said pattern is formed; and a step of forming a spacer on sidewalls of said pattern by anisotropically etching said amorphous second SiC layer.

4. A manufacturing method for a capacitor in a semiconductor memory device according to claim 3, wherein said second electrode formation step is performed by forming an amorphous third SiC layer on said dielectric film and forming a second polysilicon layer doped with impurities on said amorphous third SiC layer.

5. A manufacturing method for a capacitor in a semiconductor memory device according to claim 1, wherein the surface of said first polysilicon layer is treated by hydrogen ($H_2$) and then by phosphorus (P).

6. A manufacturing method for a capacitor in a semiconductor memory device according to claim 5, wherein said hydrogen treatment is carried out by using one selected from the group consisting of hydrogen plasma and a hydrogen radical.

7. A manufacturing method for a capacitor in a semiconductor memory device according to claim 5, wherein said hydrogen treatment is hydrogen baking process.

8. A manufacturing method for a capacitor in a semiconductor memory device according to claim 1, wherein said processes of forming said first polysilicon layer doped with impurities and forming said amorphous first SiC layer are sequentially performed in the same chamber without breaking vacuum.

9. A manufacturing method for a capacitor in a semiconductor memory device according to claim 4, wherein said processes of forming said second polysilicon layer doped with impurities and forming said amorphous third SiC layer are sequentially performed in the same chamber without breaking vacuum.

10. A manufacturing method for a capacitor in a semiconductor memory device according to claim 4, wherein said all SiC layer are formed by a plasma CVD method using one selected from the group consisting of a mixed gas of silane ($SiH_4$) and propane ($C_3H_8$) and a mixed gas of silane ($SiH_4$) and benzene ($C_6H_6$).

11. A manufacturing method for a capacitor in a semiconductor memory device according to claim 10, wherein said plasma CVD method is performed by adding one selected from the group consisting of phosphine ($PH_3$) and arsenic hydride ($AsH_3$) to said mixed gas.

12. A manufacturing method for a capacitor in a semiconductor memory device according to claim 11, wherein impurities in said all SiC layers are activated by heat treatment.

13. A manufacturing method for a capacitor in a semiconductor memory device according to claim 11, wherein said heat treatment is performed at 800° C. for 10~30 seconds under an argon (Ar) atmosphere.

14. A manufacturing method for a capacitor in a semiconductor memory device according to claim 12, wherein said heat treatment is performed by depositing and reflowing an insulating material on the entire substrate resulting from said second electrode formation step.

* * * * *